United States Patent
Zeng et al.

(10) Patent No.: US 8,426,963 B2
(45) Date of Patent: Apr. 23, 2013

(54) POWER SEMICONDUCTOR PACKAGE STRUCTURE AND MANUFACTURING METHOD THEREOF

(75) Inventors: Jian-Hong Zeng, Taoyuan Hsien (TW); Shou-Yu Hong, Taoyuan Hsien (TW)

(73) Assignee: Delta Electronics, Inc., Kuei San, Taoyuan Hsien (TW)

( * ) Notice: Subject to any disclaimer, the term of this patent is extended or adjusted under 35 U.S.C. 154(b) by 108 days.

(21) Appl. No.: 13/084,292

(22) Filed: Apr. 11, 2011

(65) Prior Publication Data

US 2012/0181706 A1 Jul. 19, 2012

(30) Foreign Application Priority Data

Jan. 18, 2011 (CN) .......................... 2011 1 0020133

(51) Int. Cl.
*H01L 23/34* (2006.01)
*H01L 23/48* (2006.01)
*H01L 23/52* (2006.01)
*H01L 29/40* (2006.01)
*H01L 21/00* (2006.01)
*H01L 21/44* (2006.01)

(52) U.S. Cl.
USPC ........... 257/723; 257/724; 257/735; 257/777; 257/E23.07; 257/E21.51; 438/109; 438/611; 438/666

(58) Field of Classification Search .................. 257/688, 257/689, 690, 692, 693, 695, 723, 724, 735, 257/736, 777; 438/109, 611, 666
See application file for complete search history.

(56) References Cited

U.S. PATENT DOCUMENTS

| | | | | |
|---|---|---|---|---|
| 4,160,308 | A * | 7/1979 | Courtney et al. | 438/25 |
| 5,218,231 | A * | 6/1993 | Kudo | 257/735 |
| 6,084,294 | A * | 7/2000 | Tomita | 257/686 |
| 6,133,626 | A * | 10/2000 | Hawke et al. | 257/686 |
| 6,573,608 | B2 * | 6/2003 | Kuwahara et al. | 257/777 |
| 6,683,385 | B2 * | 1/2004 | Tsai et al. | 257/777 |
| 6,727,581 | B2 * | 4/2004 | Abe et al. | 257/723 |
| 7,145,224 | B2 * | 12/2006 | Kawashima et al. | 257/678 |
| 7,400,038 | B2 * | 7/2008 | Sukegawa et al. | 257/724 |
| 7,408,255 | B2 * | 8/2008 | Corisis et al. | 257/686 |
| 7,615,853 | B2 * | 11/2009 | Shen et al. | 257/676 |
| 7,880,309 | B2 * | 2/2011 | Pilla | 257/777 |

(Continued)

*Primary Examiner* — David Zarneke
(74) *Attorney, Agent, or Firm* — Muncy, Geissler, Olds & Lowe, PLLC

(57) ABSTRACT

A power semiconductor package structure includes a carrier, a first power chip, a second power chip, a first conductive sheet, a second conductive sheet and a third conductive sheet. The first power chip has a first surface and a second surface opposing to the first surface. A first control electrode and a first main power electrode are disposed on the first surface, and a second main power electrode is disposed on the second surface. The second surface is disposed on the carrier, and electrically connected to the carrier through the second main power electrode. The second power chip has a third surface and a fourth surface opposing to the third surface. A third main power electrode is disposed on the third surface, and a fourth main power electrode is disposed on the fourth surface. The fourth surface is disposed on the first power chip. The first conductive sheet is electrically connected to the first main power electrode and the fourth main power electrode. The second conductive sheet is electrically connected to the third main power electrode. The third conductive sheet is electrically connected to the first control electrode. At least a part of the first control electrode is non-covered by the second power chip along a projection direction, which is perpendicular to the carrier.

21 Claims, 12 Drawing Sheets

U.S. PATENT DOCUMENTS

| | | | |
|---|---|---|---|
| 7,883,993 B2 * | 2/2011 | Fuergut et al. | 438/464 |
| 7,902,646 B2 * | 3/2011 | Liu et al. | 257/666 |
| 8,017,440 B2 * | 9/2011 | Machida | 438/109 |
| 8,124,449 B2 * | 2/2012 | Meyer-Berg et al. | 438/107 |
| 2001/0052641 A1 * | 12/2001 | Kuo et al. | 257/686 |
| 2002/0163077 A1 * | 11/2002 | Kuwahara et al. | 257/723 |
| 2006/0197200 A1 * | 9/2006 | Kajiwara et al. | 257/673 |
| 2007/0132073 A1 * | 6/2007 | Tiong et al. | 257/666 |
| 2007/0138628 A1 * | 6/2007 | Lam | 257/723 |
| 2010/0244227 A1 * | 9/2010 | Kim et al. | 257/692 |
| 2011/0227207 A1 * | 9/2011 | Yilmaz et al. | 257/676 |

* cited by examiner

POWER SEMICONDUCTOR PACKAGE STRUCTURE AND MANUFACTURING METHOD THEREOF

CROSS REFERENCE TO RELATED APPLICATIONS

This Non-provisional application claims priority under 35 U.S.C. §119(a) on Patent Application No(s). 201110020133.1 filed in People's Republic of China on Jan. 18, 2011, the entire contents of which are hereby incorporated by reference.

BACKGROUND OF THE INVENTION

1. Field of Invention

The present invention relates to a package structure and a manufacturing method thereof. In particular, the present invention relates to a power semiconductor package structure and a manufacturing method thereof.

2. Related Art

Higher efficiency and higher density are always the demands for the power converters. The higher efficiency indicates the lower power loss, so that this feature can help the power saving. The higher density indicates the smaller product size, so that this feature can achieve the product design of compact and light.

FIG. 1A shows a full-bridge circuit 1A used in the conventional power converter, and FIG. 1B shows a buck circuit 1B used in the conventional power converter. As shown in FIG. 1A, the full-bridge circuit 1A includes four field-effect transistors 11. The four field-effect transistors 11 are divided into two groups and are alternately turned on/off for performing the rectifying function. As shown in FIG. 1B, the buck circuit 1B includes two field-effect transistors 11, and it can convert the voltage by switching the field-effect transistors 11. As a result, the power semiconductor element is one important factor for the efficiency of the power converter.

In practice, the conventional full-bridge circuit 1A and buck circuit 1B include four and two separated field-effect transistors 11, respectively, which are electrically connected through the wires or traces of the circuit board. However, this connection has the issues of poor usage in space and obvious parasitic effect.

In order to improve the above issues, a power semiconductor package structure 2A as shown in FIG. 2A is disclosed. The power semiconductor package structure 2A includes a lead frame 21, a plurality of chips 22, a plurality of wires 23, and a molding compound 24. The chips 22 are arranged in parallel on the pads of the lead frame 21, and each chip 22 is connected to other chip(s) 22 and the corresponding lead through the wires 23. The molding compound 24 covers the chips 22, wires 23 and a part of the lead frame 21.

However, the above technologies of surface integration and wire bonding still have many drawbacks. For example, the conventional field-effect transistor is commonly the vertical structure, and the electrode of the source thereof is usually formed by aluminum evaporation. The thickness of the aluminum pad is within several tens micrometers. In order to perform the following surface brazing soldering and metallization, the thickness of aluminum pad is usually about 5 μm. Since the thickness of the aluminum pad is very small, the lateral resistance is relatively large. Taking a 1 cm×1 cm chip as an example, the resistance between two opposite sides of the chip is up to 5.3 mΩ. In addition, due to the limitation of the wire bonding process, the contact surface between the wire and the source can not cover most area of the source (usually less than 70%). Moreover, since the lateral resistance of the chip is larger, the current distribution between the source and drain of the chip is non-uniform, which is different from the ideal situation, and the current may be concentrated at some points. Besides, the resistance of the wire is usually larger, so the current parasitic effect is very obvious. In addition, the integration level of the surface integrating process can still be improved. Thus, a better solution is desired.

In order to reduce the size of the package structure, a stacked package structure is disclosed. As shown in FIG. 2B, a power semiconductor package structure 2B includes a lead frame 21, a plurality of chips 22, a plurality of wires 23, and a molding compound 24. In this case, the chips 22 are stacked on the lead frame 21 one by one, and a spacer 25 is configured between every two chips 22 so as to provide a predetermined height between the chips 22. Accordingly, the wires 23 can electrically connect the pads of the chips 22 to the pads of the lead frame 21. The molding compound 24 covers the chips 22, the wires 23 and a part of the lead frame 21.

Although the power semiconductor package structure 2B, for packaging multiple chips 22, has the benefit of a smaller size than the power semiconductor package structure 2A, it has a drawback of a difficulty on electrically connecting the pads of the chips 22 and the lead frame 21 due to the stacked structure. In addition, the gaps between the electrodes of the chips 22 must be completely covered by the molding compound 24 so as to achieve the desired isolation and prevent the undesired bubbles, which may decrease the reliability of the package. When the top chip 22 totally covers the gap, the flowing channel for the molding compound 24 becomes narrower. This may make the flowing/filling of the molding compound 24 more difficult so as to form some pores or bubbles, thereby decreasing the reliability of the package structure. Thus, the mold flow design is very important, and some special auxiliary processes, such as an underfill dispensing process or a vacuum process, are needed. These additional auxiliary processes may increase the complex of the manufacturing processes.

Either the power semiconductor package structure 2A or the power semiconductor package structure 2B uses the wires 23 to connect the chips 22 and the lead frame 21. However, since the resistance of the wires 23 is large, and the contact areas between the wires 23 and the chips 22 or between the wires 23 and the lead frame 21 are small, the obvious parasitic effect and current non-uniform may occur. Accordingly, the ripple of the component is increased, or the switching speed of the component is affected, which dramatically increases the on loss and switching loss. This can affect the properties and efficiencies of the power semiconductor package structures 2A and 2B.

Therefore, it is an important subject of the present invention to provide a power semiconductor package structure that has increased reliability and reduced parasitic effect, thereby enhancing the efficiency thereof.

SUMMARY OF THE INVENTION

In view of the foregoing subject, an objective of the present invention is to provide a power semiconductor package structure, which has increased reliability, reduced parasitic effect and enhanced efficiency, and a manufacturing method thereof.

To achieve the above objective, the present invention discloses a power semiconductor package structure including a carrier, a first power chip, a second power chip, a first conductive sheet, a second conductive sheet and a third conductive sheet. The first power chip has a first surface and a second surface opposing to the first surface. A first control electrode and a first main power electrode are disposed on the first surface, and a second main power electrode is disposed on the second surface. The second surface is disposed on the carrier and electrically connected to the carrier through the second main power electrode. The second power chip has a third surface and a fourth surface opposing to the third surface. A third main power electrode is disposed on the third surface, and a fourth main power electrode is disposed on the fourth surface. The fourth surface is disposed on the first power chip. The first conductive sheet is electrically connected to the first main power electrode and the fourth main power electrode. The second conductive sheet is electrically connected to the third main power electrode. The third conductive sheet is electrically connected to the first control electrode. At least a part of the first control electrode is non-covered by the second power chip along a projection direction perpendicular to the carrier.

In one aspect of the present invention, the entire first control electrode is non-covered by the second power chip along the projection direction perpendicular to the carrier.

In one aspect of the present invention, the second power chip further includes a second control electrode and a fourth conductive sheet. The second control electrode is disposed on the third surface. The fourth conductive sheet is electrically connected to the second control electrode. Each of the first conductive sheet, the second conductive sheet, the third conductive sheet, and the fourth conductive sheet is a metal sheet.

In one aspect of the present invention, at least one of the first conductive sheet, the second conductive sheet, the third conductive sheet, and the fourth conductive sheet has a recess.

In one aspect of the present invention, at least one of the first conductive sheet, the second conductive sheet, the third conductive sheet, and the fourth conductive sheet has a plurality of bending portions.

In one aspect of the present invention, the power semiconductor package structure further includes a molding compound covering the first power chip, the second power chip, a part of the carrier, a part of the first conductive sheet, a part of the second conductive sheet, a part of the third conductive sheet, and a part of the fourth conductive sheet. At least one of the first conductive sheet, the second conductive sheet, the third conductive sheet, and the fourth conductive sheet is not electrically connected with the carrier and protruded out of the molding compound.

In one aspect of the present invention, the third conductive sheet has a step shape, and one end portion of the third conductive sheet connecting to the first control electrode has a thickness smaller than that of other portions thereof.

In one aspect of the present invention, the power semiconductor package structure further includes a third power chip, a fourth power chip and a fifth conductive sheet. The third power chip has a fifth surface and a sixth surface opposing to the fifth surface. A third control electrode and a fifth main power electrode are disposed on the fifth surface, and a sixth main power electrode is disposed on the sixth surface. The sixth surface is disposed on the carrier and electrically connected to the carrier through the sixth main power electrode. The fourth power chip has a seventh surface and an eighth surface opposing to the seventh surface. A fourth control electrode and a seventh main power electrode are disposed on the seventh surface, and an eighth main power electrode is disposed on the eighth surface. The eighth surface is disposed on the third power chip. The fifth conductive sheet is electrically connected to the fifth main power electrode and the eighth main power electrode. The second conductive sheet is electrically connected with the third main power electrode and the seventh main power electrode.

In one aspect of the present invention, the power semiconductor package structure further includes a supporter disposed between the carrier and the second power chip for supporting the second power chip. The supporter can be an elastic element, a capacitor, or a diode.

To achieve the above objective, the present invention also discloses a power semiconductor package structure including a carrier, a first power chip, a second power chip, a first conductive sheet and a second conductive sheet. The first power chip has a first surface and a second surface opposing to the first surface. A first control electrode and a first main power electrode are disposed on the first surface, and a second main power electrode is disposed on the second surface. The second surface is disposed on the carrier and electrically connected to the carrier through the second main power electrode. The second power chip has a third surface and a fourth surface opposing to the third surface. A third main power electrode is disposed on the third surface, and a fourth main power electrode is disposed on the fourth surface. The fourth surface is disposed on the first power chip. The first conductive sheet is electrically connected to the first main power electrode and the fourth main power electrode. The second conductive sheet is electrically connected to the third main power electrode. The dimension of the second power chip is not smaller than that of the first power chip, and at least a part of the first control electrode is non-covered by the second power chip along a projection direction perpendicular to the carrier.

In one aspect of the present invention, the entire first control electrode is non-covered by the second power chip along the projection direction perpendicular to the carrier.

In one aspect of the present invention, the second power chip further includes a second control electrode, a first electronic connector and a second electronic connector. The second control electrode is disposed on the third surface. The first electronic connector is electrically connecting to the first control electrode, and the second electronic connector is electrically connecting to the second control electrode. Each of the first conductive sheet and the second conductive sheet is a metal sheet, and each of the first electronic connector and the second electronic connector is a bonding wire.

In one aspect of the present invention, at least one of the first conductive sheet and the second conductive sheet has a recess.

In one aspect of the present invention, the power semiconductor package structure further includes a third power chip, a fourth power chip, and a fifth conductive sheet. The third power chip has a fifth surface and a sixth surface opposing to the fifth surface. A third control electrode and a fifth main power electrode are disposed on the fifth surface, and a sixth main power electrode is disposed on the sixth surface. The sixth surface is disposed on the carrier and electrically connected to the carrier through the sixth main power electrode. The fourth power chip has a seventh surface and an eighth surface opposing to the seventh surface. A fourth control electrode and a seventh main power electrode are disposed on the seventh surface, and an eighth main power electrode is disposed on the eighth surface. The eighth surface is disposed on the third power chip. The fifth conductive sheet is electrically connected to the fifth main power electrode and the eighth main power electrode. The second conductive sheet is electrically connected with the third main power electrode and the seventh main power electrode.

In one aspect of the present invention, the power semiconductor package structure further includes a supporter disposed between the carrier and the second power chip for supporting the second power chip. The supporter can be an elastic element, a capacitor, or a diode.

To achieve the above objective, the present invention further discloses a manufacturing method of a power semiconductor package structure including the steps of: disposing a first power chip on a carrier, wherein the first power chip has a first control electrode; disposing a first conductive sheet on the first power chip; disposing a second power chip on the first conductive sheet, wherein at least a part of the first control electrode is non-covered by the second power chip along a projection direction perpendicular to the carrier; disposing a second conductive sheet on the second power chip; disposing a third conductive sheet to electrically connecting with the first control electrode of the first power chip; disposing a fourth conductive sheet to electrically connecting with the second power chip; and disposing a molding compound to cover the first power chip and the second power chip.

In one aspect of the present invention, the carrier includes a plurality of carrying units arranged in matrix, and a plurality of first power chips are disposed on the carrying units respectively.

In one aspect of the present invention, the first conductive sheet and the third conductive sheet are integrally formed as one piece to form a plurality of first electronic connecting units arranged in matrix, the second conductive sheet and the fourth conductive sheet are integrally formed as one piece to form a plurality of second electronic connecting units arranged in matrix, and the first electronic connecting units and the second electronic connecting units are disposed corresponding to the carrying units respectively.

In one aspect of the present invention, the molding compound covers the carrying units, the first electronic connecting units, and the second electronic connecting units.

In one aspect of the present invention, the carrying units, the first electronic connecting units, and the second electronic connecting units comprise a plurality of cutting channels respectively, and the cutting channels are relatively disposed between the carrying units, the first electronic connecting units, and the second electronic connecting units, so that the power semiconductor package structure is separated based on the cutting channels.

As mentioned above, in the power semiconductor package structure of the present invention, at least a part of the first control electrode, which is disposed underneath the first power chip, is non-covered by the second power chip stacked thereabove along a projection direction perpendicular to the carrier. Thus, it is unnecessary to apply additional protection material to isolate the first control electrode from the bottom of the second power chip. In addition, the present invention uses the conductive sheets to electrically connect the electrodes of the first and second power chips, so that the parasitic effect caused by the bonding wires can be avoided. Accordingly, the reliability can be increased, the parasitic effect can be reduced, and the efficiency can be enhanced.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
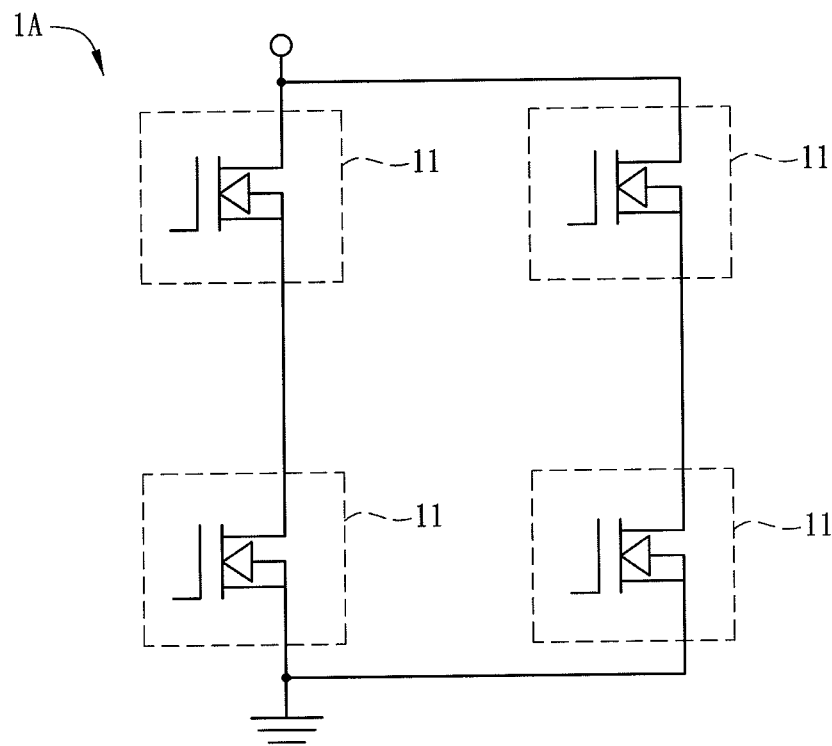
FIG. 1A is a schematic diagram showing a conventional full-bridge circuit.
Figure 1B:
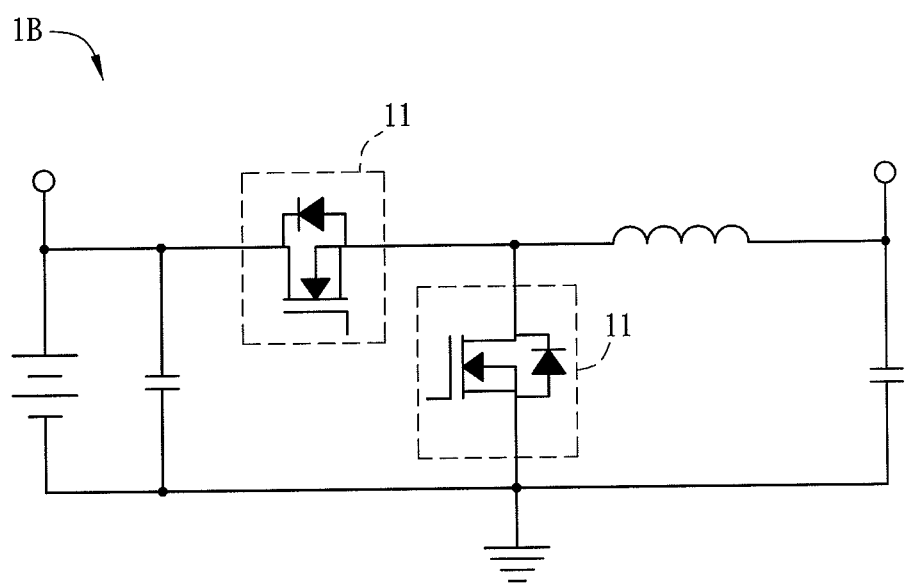
FIG. 1B is a schematic diagram showing a conventional buck circuit.
Figure 2A:
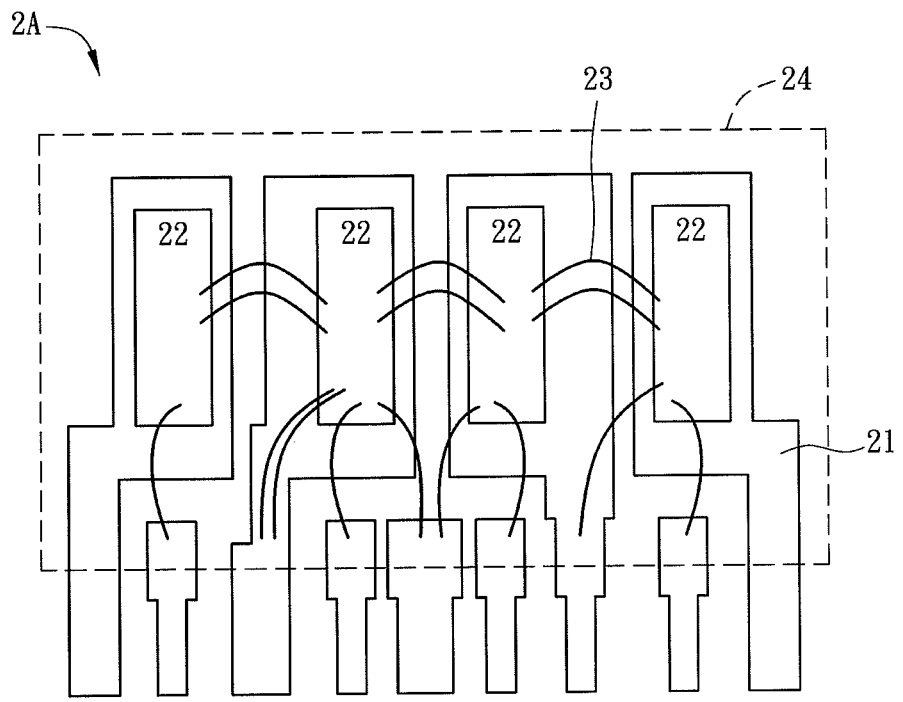
FIG. 2A is a schematic diagram showing a conventional power semiconductor package structure.
Figure 2B:
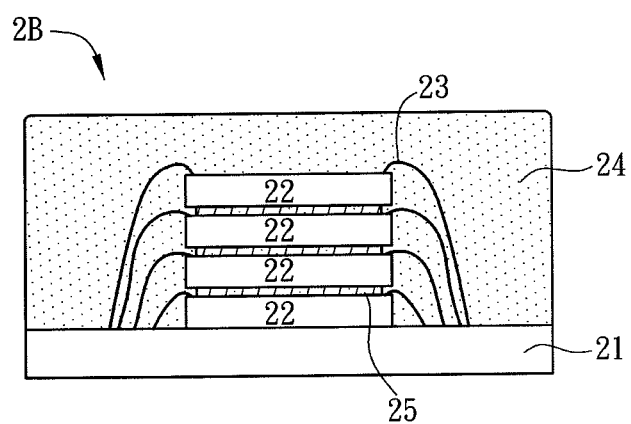
FIG. 2B is a cross-sectional view of the conventional power semiconductor package structure.
Figure 3:
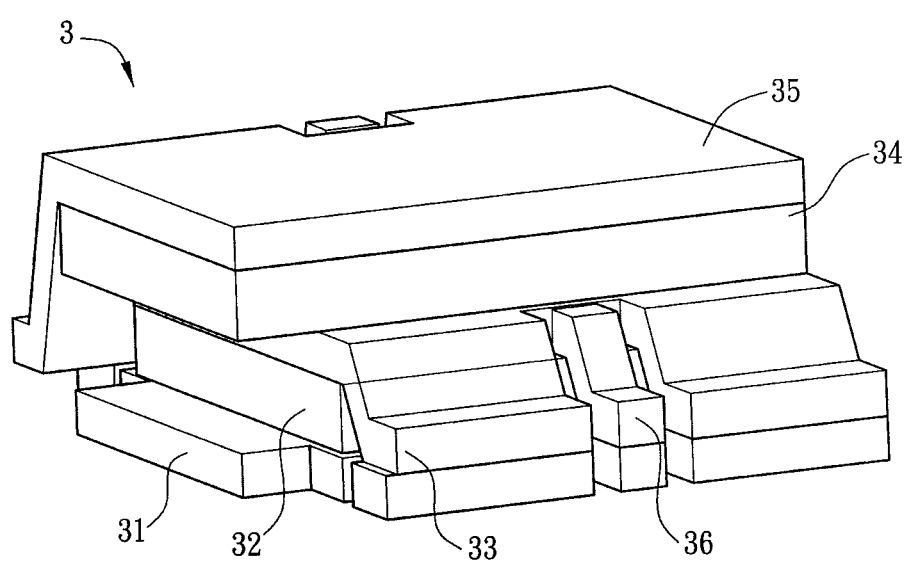
FIG. 3 is a schematic diagram showing a power semiconductor package structure according to a preferred embodiment of the present invention.

FIG. 3 is a perspective view of a power semiconductor package structure 3 according to a preferred embodiment of the present invention. As shown in FIG. 3, the power semiconductor package structure 3 includes a carrier 31, a first power chip 32, a first conductive sheet 33, a second power chip 34, a second conductive sheet 35, and a third conductive sheet 36.

The first power chip 32 has a first surface, a second surface, a first control electrode (not shown), a first main power electrode (not shown), and a second main power electrode (not shown). The first and second surfaces are disposed opposite to each other, and the second surface is connected to the carrier 31. The first control electrode and the first main power electrode are disposed on the first surface, and the second main power electrode is disposed on the second surface. The first power chip 32 is electrically connected to the carrier 31 through the second main power electrode.

The second power chip 34 has a third surface, a fourth surface, a third main power electrode (not shown), and a fourth main power electrode (not shown). The third and fourth surfaces are disposed opposite to each other, and the fourth surface is connected to the first power chip 32. The third main power electrode is disposed on the third surface, and the fourth main power electrode is disposed on the fourth surface.

The first conductive sheet 33 is electrically connected to the first main power electrode of the first power chip 32 and the fourth main power electrode of the second power chip 34. The second conductive sheet 35 is electrically connected to the third main power electrode of the second power chip 34. The third conductive sheet 36 is electrically connected to the first control electrode of the first power chip 32. At least a part of the first control electrode is non-covered by the second power chip 34 along a projection direction perpendicular to the carrier 31.

In this embodiment, since the first control electrode is located at the edge of the first power chip 32 and electrically connected with the third conductive sheet 36, the entire first control electrode of the first power chip 32 is not covered by the second power chip 34 along a projection direction perpendicular to the carrier 31.

To be noted, regarding to the design of the power converter, which usually has the full-bridge and half-bridge circuits with structural symmetry, the field-effect transistors with the same spec are usually selected. Besides, regarding to the buck circuit, which usually includes two field-effect transistors with different properties, the chips with different specs are usually selected. In practice, the chips adopted in the package structure may have the following three conditions of (1) the dimension of the first power chip 32 is equal to that of the second power chip 34, (2) the dimension of the first power chip 32 is larger than that of the second power chip 34, and (3) the dimension of the first power chip 32 is smaller than that of the second power chip 34.

The above-mentioned "dimension" includes the area, length, etc. The condition (1) that the dimension of the first power chip 32 is equal to that of the second power chip 34 indicates that, in a specific arrangement, a projection of the second power chip 34 alone the direction perpendicular to the carrier 31 is essentially overlapped with a projection of the first power chip 32 alone the direction perpendicular to the carrier 31. The condition (2) that the dimension of the first power chip 32 is larger than that of the second power chip 34 indicates that, in a specific arrangement, the projection of the first power chip 32 alone the direction perpendicular to the carrier 31 is larger than and can cover the projection of the second power chip 34 alone the direction perpendicular to the carrier 31. The condition (3) that the dimension of the first power chip 32 is smaller than that of the second power chip 34 indicates that, in a specific arrangement, the longer length of the second power chip 34 is larger than that of the first power chip 32.

The package structure shown in FIG. 3, which is a quad flat no-lead (QFN) package, is used for illustration only and is not to limit the scope of the present invention. Of course, the present invention can be applied to quad flat package (QFP), dual in-line package (DIP), or other types of packages. The skilled person should know that the manufacturing processes for different types of packages should be properly modified, so the detailed modification will be omitted. The following embodiments will be illustrated with taking the QFN package as an example.

In this embodiment, the first control electrode is located at the center of one edge of the first power chip 32, and the third main power electrode is located at the center of one edge of the second power chip 34. However, in some embodiments, the first control electrode may be located at one corner of the first power chip 32, and the third main power electrode may be located at one corner of the second power chip 34.

The above-mentioned conditions (1) to (3) will be described with reference to FIGS. 4A to 4C, respectively.

Figure 4A:
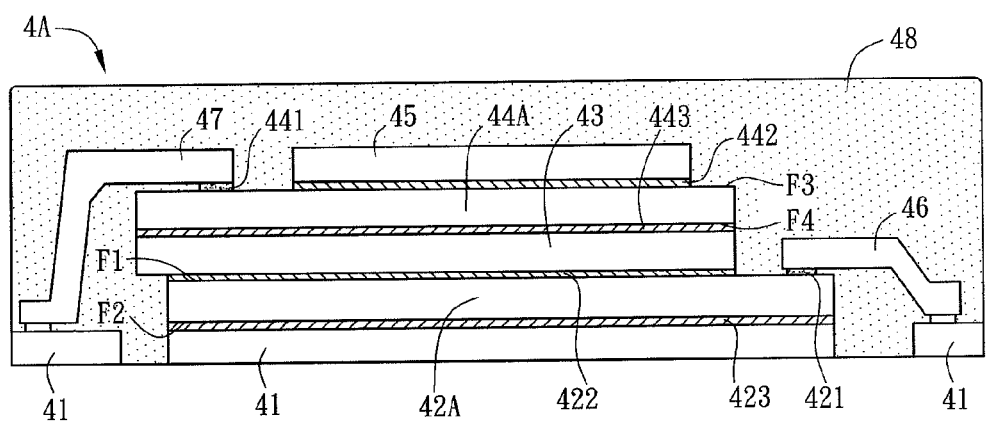
FIG. 4A is a cross-sectional view of a power semiconductor package structure according to the preferred embodiment of the present invention.

FIG. 4A is a cross-sectional view of a power semiconductor package structure 4A according to the preferred embodiment of the present invention. The power semiconductor package structure 4A includes a carrier 41, a first power chip 42A, a first conductive sheet 43, a second power chip 44A, a second conductive sheet 45, a third conductive sheet 46, a fourth conductive sheet 47, and a molding compound 48.

The first power chip 42A has a first control electrode 421, a first main power electrode 422, and a second main power electrode 423. The first control electrode 421 and the first main power electrode 422 are disposed on the first surface F1, and the second main power electrode 423 is disposed on the second surface F2. The first power chip 42A is disposed on and electrically connected to the carrier 41 through the second main power electrode 423. The first conductive sheet 43 is disposed on the first power chip 42A and electrically connected to the first main power electrode 422 of the first power chip 42A. The second power chip 44A has a second control electrode 441, a third main power electrode 442, and a fourth main power electrode 443. The second control electrode 441 and the third main power electrode 442 are disposed on the third surface F3, and the fourth main power electrode 443 is disposed on the fourth surface F4. The second power chip 44A is disposed on and electrically connected to the first conductive sheet 43 through the fourth main power electrode 443. In other words, the first main power electrode 422 of the first power chip 42A is electrically connected to the fourth main power electrode 443 of the second power chip 44A through the first conductive sheet 43. The above electrical connection can be carried out through an adhesive layer, which is made of the conductive material such as conductive adhesive, conductive resin, low-temperature sintered conductive plasma, or solder. To be noted, any electrical connection in this invention can be carried out by the above-mentioned method and material, so the detailed description will not be repeated.

The second conductive sheet 45 is disposed on the second power chip 44A and is electrically connected to the third main power electrode 442 of the second power chip 44A. One end of the third conductive sheet 46 is electrically connected to the first control electrode 421 of the first power chip 42A, and the other end thereof is electrically connected to the carrier 41. One end of the fourth conductive sheet 47 is electrically connected to the second control electrode 441 of the second power chip 44A, and the other end thereof is electrically connected to the carrier 41. The molding compound 48 covers the first power chip 42A and the second power chip 44A.

In practice, each of the first conductive sheet 43, the second conductive sheet 45, the third conductive sheet 46, and the fourth conductive sheet 47 is a metal sheet having a thickness between 60 μm to 500 μm. Alternatively, the first conductive sheet 43, the second conductive sheet 45, the third conductive sheet 46, or the fourth conductive sheet 47 is a metal sheet, which is made of iron, cupper, aluminum, gold, silver, or alloy containing any of the above elements.

In this embodiment, the dimension of the second power chip 44A is equal to that of the first power chip 42A, and the projections of the first control electrode 421 and the second power chip 44A along the direction perpendicular to the carrier 41 are not overlapped. Besides, each of the first power chip 42A and the second power chip 44A is a field-effect transistor (FET), and is preferably a metal-oxide-semiconductor field-effect transistor (MOSFET). To be noted, the embodiment is not limited to this. For example, the first power chip 42A and the second power chip 44A can be other power semiconductor chips, such as the insulated gate bipolar transistor (IGBT), SiC power semiconductor switch, etc. In this embodiment, the first control electrode 421 and the second control electrode 441 are the gate of the field-effect transistor, the first main power electrode 422 and the third main power electrode 442 are the source of the field-effect transistor, and the second main power electrode 423 and the fourth main power electrode 443 are the drain of the field-effect transistor.

In general, the power semiconductor chip has the main power electrodes (e.g. source and drain) and control electrode (e.g. gate), but the diode does not have the control electrode. If the second power chip 44A is a diode, it only includes the third main power electrode 442 and the fourth main power electrode 443, but does not include the second control electrode 441.

Since the power electrode of the power semiconductor chip usually has larger output current, and the control electrode thereof usually has smaller output current, the electrode lead-out process of the control electrode may be carried out by the circular or flat solder process when the parasitic parameter control of the control loop is not so critical.

Regarding to the field-effect transistor with vertical structure, the source and drain thereof are disposed on the opposite sides of the chip. Since the voltage difference between the gate and the source is lower, the insulation therebetween is easier. Thus, the gate and the source are usually both disposed on the front side of the chip. Of course, in some other circumstances, the drain and the gate may be both disposed on the same side of the chip. That is, the first main power electrode 422 and third main power electrode 442 can be the drain of the field-effect transistor, and the second main power electrode 423 and fourth main power electrode 443 can be the source of the field-effect transistor.

This embodiment only discloses the stacked structure of two chips, but the invention is not limited to this. In some embodiment, it is possible to stack more chips over the second power chip according to the actual requirements, and the detailed description will not be repeated.

According to the above-mentioned configuration, the first power chip 42A and the second power chip 44A are vertically stacked and misaligned with each other, and the first control electrode 421 is not blocked by the second power chip 44A. Thus, the molding compound 48 can completely cover the first power chip 42A and the second power chip 44A with avoiding the pores and bubbles in the molding compound 48. In addition, this structure can also enhance the connection of the molding compound 48 with the first power chip 42A and the second power chip 44A, thereby enhancing the structural strength and reliability of the package structure.

Besides, the third conductive sheet 46 has sufficient space for the connection of the first control electrode 421 so as to decrease the complex of the manufacturing processes. Compared with the conventional package structure using the wire connection, the present embodiment uses the first conductive sheet 43, the second conductive sheet 45, the third conductive sheet 46 and the fourth conductive sheet 47, which are made of metal sheets, to carry out the electrical connection between the first and second power chips 42A and 44A, between the first power chip 42A and the carrier 41, and between the second power chip 44A and the carrier 41, so that the parasitic effect can be obviously reduced.

In addition, the projection of the second power chip 44A along the direction perpendicular to the carrier 41 can at least partially misalign with the first control electrode 421 of the first power chip 42A, and partially protrude from the outline of the first power chip 42A. Regarding the conventional failed packages, the lamination between the molding compound and the chip/metal electrode is one common reason forming the failed packages. This undesired lamination leads to a partial stress to focus on the chip and may further cause the malfunction of the electronic property of the chip. The stacked and misaligned structure of the present invention, however, can allow the molding compound 48 to perfectly cover the first power chip 42A, the second power chip 44A and the metal electrodes. Thus, the molding compound 48 can firmly encapsulate the elements inside the package structure, and it is very difficult to generate the leakage inside the package structure. Consequently, the stacked and misaligned structure of the present invention can sufficiently enhance the reliability of the product.

Figure 4B:
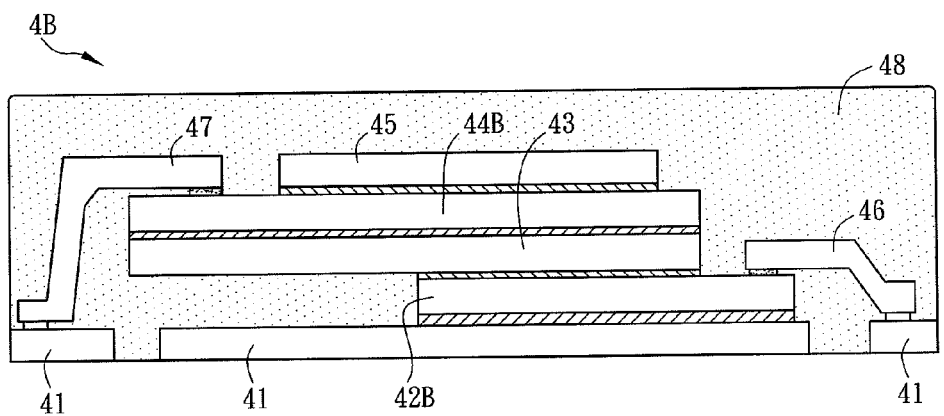
FIG. 4B is a cross-sectional view of another power semiconductor package structure according to the preferred embodiment of the present invention.

With reference to FIG. 4B, a power semiconductor package structure 4B is different from the previous power semiconductor package structure 4A in that the dimension of the upper second power chip 44B is larger than that of the lower first power chip 42B. In this case, there is larger space underneath the second power chip 44B. In practice, since the first power chip 42B, the second power chip 44B and the carrier 41 are electrically connected through the first conductive sheet 43, the second conductive sheet 45, the third conductive sheet 46 and the fourth conductive sheet 47, the pressure and vibration caused by the conventional wire bonding can be avoided. This can reduce the risk of damaging the power chips. Of course, the structure of this embodiment can be applied to the above-mentioned buck circuit, and the upper second power chip 44B can correspond to the switch element with larger voltage.

Figure 4C:
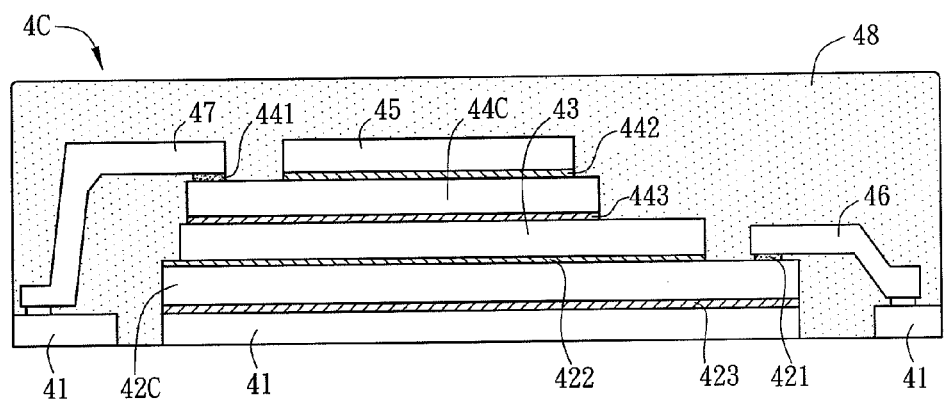
FIG. 4C is a cross-sectional view of another power semiconductor package structure according to the preferred embodiment of the present invention.

With reference to FIG. 4C, a power semiconductor package structure 4C is different from the previous power semiconductor package structure 4A in that the dimension of the upper second power chip 44C is smaller than that of the lower first power chip 42C. The structure of this embodiment can be applied to the above-mentioned buck circuit, and the lower first power chip 42C can correspond to the switch element with larger voltage. In this case, the drain and gate of the lower first power chip 42C and the upper second power chip 44C are disposed on the same surface.

Figure 5A:
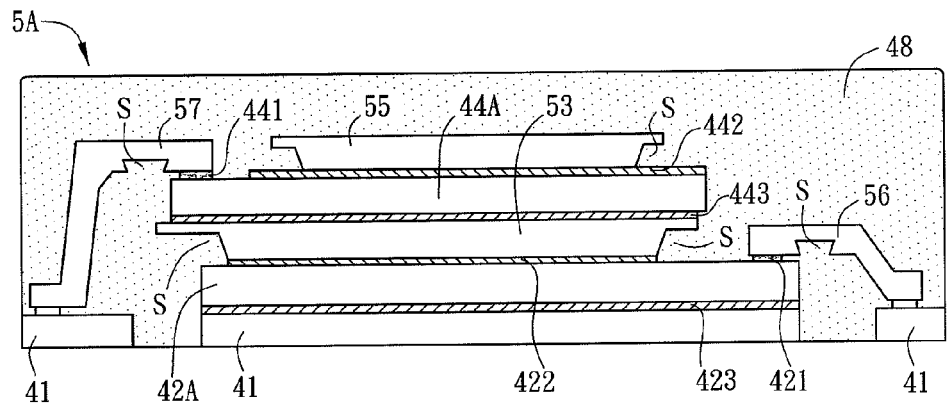
FIGS. 5A and 5B are cross-sectional views of aspects of the power semiconductor package structure according to the preferred embodiment of the present invention.

FIG. 5A is a cross-sectional view of another power semiconductor package structure 5A according to the preferred embodiment of the present invention. The power semiconductor package structure 5A is different from the previous power semiconductor package structure 4A in that at least one of the first conductive sheet 53, the second conductive sheet 55, the third conductive sheet 56, and the fourth conductive sheet 57 includes at least one recess S. Similarly, the previously mentioned power semiconductor package structures 4B and 4C can be modified by adding the recess.

In this embodiment, the first conductive sheet 53, the second conductive sheet 55, the first power chip 42A, and the second power chip 44A are connected by adhesive layers, which are usually liquid or semi-solid material such as conductive gel or solder. Since the elements are pressed during the package processes, the conductive gel or solder is pressed to flow toward the edges of the first power chip 42A or the second power chip 44A. If the conductive gel or solder flows over the first power chip 42A or the second power chip 44A, the electrodes of the first power chip 42A or the second power chip 44A may be shorted. The present embodiment configures the recess S for accommodating the overflowed conductive gel or solder to prevent it from flowing over the edges of the first power chip 42A or the second power chip 44A. Thus, the overflow of the conductive gel or solder can be reduced, and the production yield of the package can be increased.

Figure 5B:
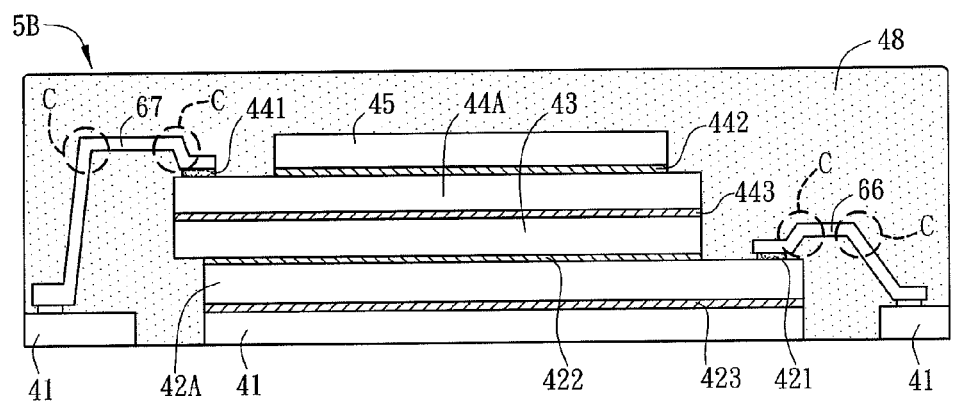

FIG. 5B is a cross-sectional view of another power semiconductor package structure 5B according to the preferred embodiment of the present invention. Compared with the previous power semiconductor package structure 4A, the third conductive sheet 66 and the fourth conductive sheet 67 of the power semiconductor package structure 5B have a plurality of bending portions C. Due to the configuration of the bending portions C, the power semiconductor package structure 5B can prevent the short circuit caused by the overflowed conductive gel or solder. To be noted, the number as well as the bending angle and shape of the bending portions C of the third conductive sheet 66 and the fourth conductive sheet 67 are not limited to the above aspect.

Figure 6:
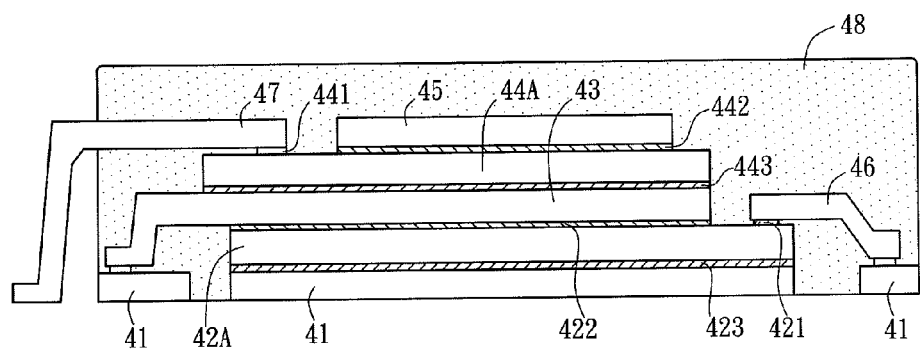
FIG. 6 is a cross-sectional view of another aspect of the power semiconductor package structure according to the preferred embodiment of the present invention.

For some circumstance that the density of the leads is high, the dimension of the carrier 41 is insufficient to configure more leads, so it is difficult to connect with external components through only the carrier 41. In addition, for some circumstance that the package dimension is not so critical, the bonding wires can be used to electrically connect the leads. Since the bonding wires have superior force absorbing ability, the reliability thereof is relatively higher. As shown in FIG. 6, according to the design or requirement of the real products, one end of the fourth conductive sheet 47 can directly protrude out of the molding compound 48 to form a lead without connecting to the carrier 41. In practice, the first conductive sheet 43, the second conductive sheet 45, and the third conductive sheet 46 can protrude out of the molding compound 48 to form leads.

Figure 7:
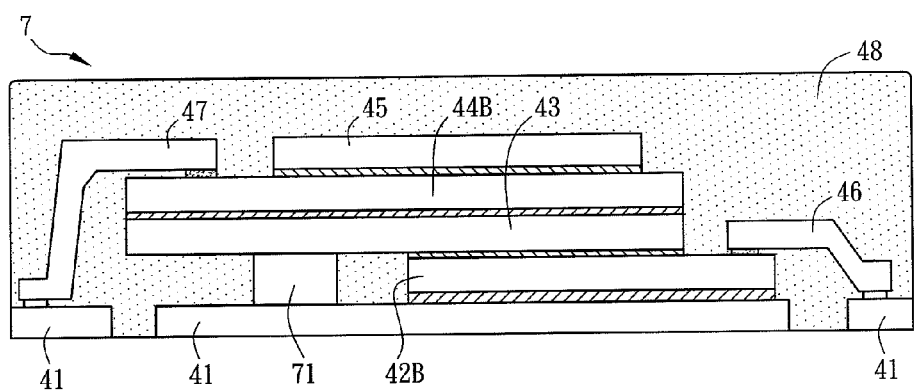
FIG. 7 is a cross-sectional view of another aspect of the power semiconductor package structure according to the preferred embodiment of the present invention.

FIG. 7 is a cross-sectional view of another power semiconductor package structure 7 according to the preferred embodiment of the present invention. If the difference between the dimensions of the first power chip 42B and the second power chip 44B is too large, or overlapped portion of the projections of the first power chip 42B and the second power chip 44B along the direction perpendicular to the carrier is too small, the second power chip 44B may be not firmly disposed on the first power chip 42B during the package processes. In order to solve this problem, the power semiconductor package structure 7 further includes a supporter 71. In this embodiment, the supporter 71 is disposed between the carrier 41 and the second power chip 44B. The supporter 71 can be an elastic element for providing both support and buffer functions. Of course, according to the actual requirement and circuit design of the product, the supporter 71 can be a diode, a capacitor, or any other passive component.

Figure 8A:
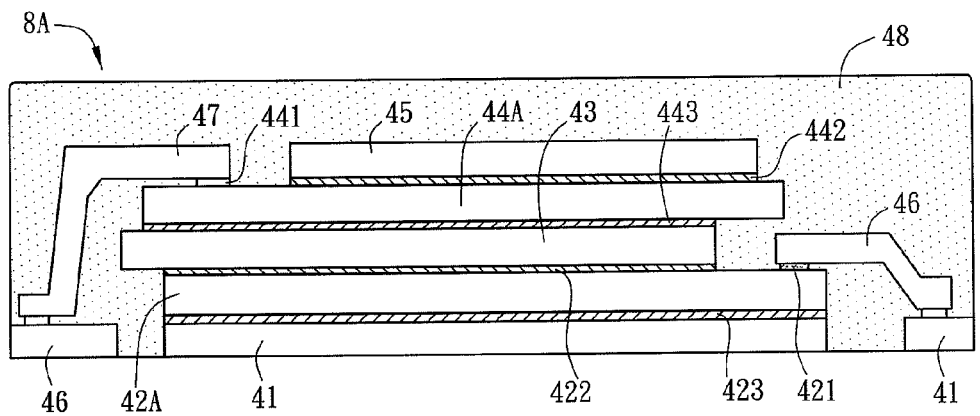
FIGS. 8A and 8B are cross-sectional views of other aspects of the power semiconductor package structure according to the preferred embodiment of the present invention.
Figure 8B:
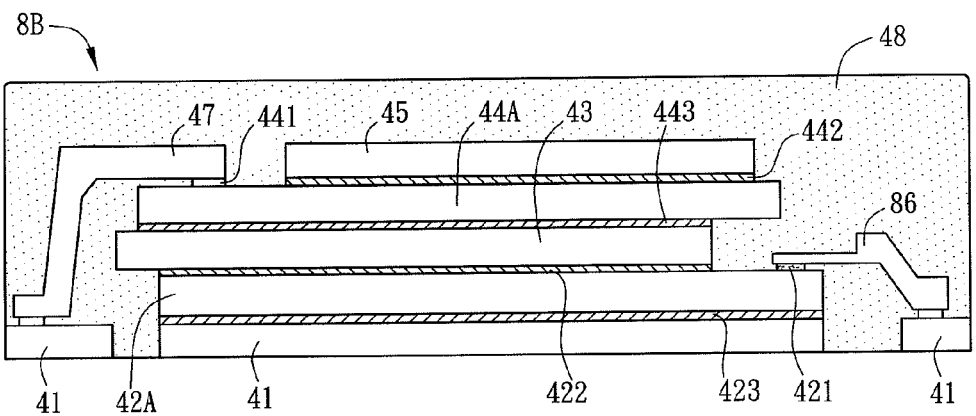

Referring to FIG. 8A, for the circumstance of higher requirement for the internal space of the package structure, a power semiconductor package structure 8A is characterized in that the projection of the second power chip 44A along the direction perpendicular to the carrier is partially overlapped with that of the first control electrode 421. Referring to FIG. 8B, in order to prevent the second power chip 44A from affecting the injection of the molding compound 48, a power semiconductor package structure 8B has a third conductive sheet 86 with a step shape. Thus, the thickness of the third conductive sheet 86 around the first control electrode 421 is smaller than that of other portions thereof, so that a larger space within the rear side of the second power chip 44A and the first control electrode 421 of the first power chip 42A is provided. This larger space allows the injection of the molding compound 48 much easier so as to prevent the short circuit between the fourth main power electrode 443 of the second power chip 44A and the first control electrode 421 of the first power chip 42A.

Figure 9:
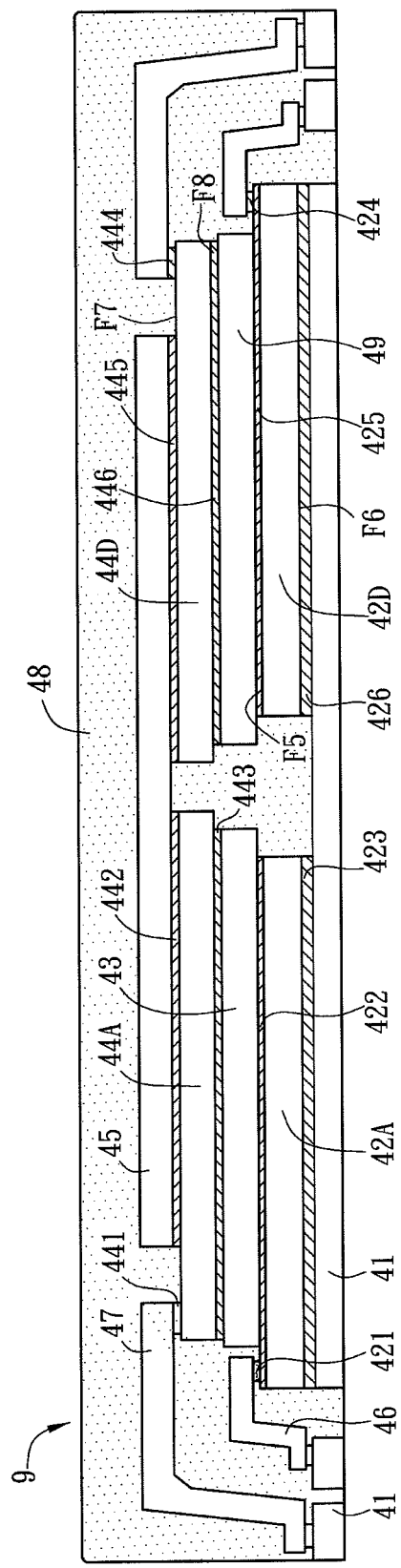
FIG. 9 is a cross-sectional view of another aspect of the power semiconductor package structure according to the preferred embodiment of the present invention.

With reference to FIG. 9, a power semiconductor package structure 9 further includes a third power chip 42D, a fourth power chip 44D, and a fifth conductive sheet 49. The third power chip 42D has a fifth surface F5, a sixth surface F6, a third control electrode 424, a fifth main power electrode 425, and a sixth main power electrode 426. The fifth surface F5 and the sixth surface F6 are disposed opposite to each other. The third control electrode 424 and a fifth main power electrode 425 are disposed on the fifth surface F5, and the sixth main power electrode 426 is disposed on the sixth surface F6. The third power chip 42D is electrically connected to the carrier 41 through the sixth main power electrode 426. The fourth power chip 44D has a seventh surface F7, an eighth surface F8, a fourth control electrode 444, a seventh main power electrode 445, and an eighth main power electrode 446. The seventh surface F7 and the eighth surface F8 are disposed opposite to each other. The fourth control electrode 444 and the seventh main power electrode 445 are disposed on the seventh surface F7, and the eighth main power electrode 446 is disposed on the eighth surface F8. The fifth conductive sheet 49 is electrically connected to the fifth main power electrode 425 and the eighth main power electrode 446. The second conductive sheet 45 is electrically connected to the third main power electrode 442 and the seventh main power electrode 445. In specific, the arrangement relation between the third power chip 42D and the fourth power chip 44D is the same as that between the first power chip 42A and the second power chip 44A. In this embodiment, the first power chip 42A, the second power chip 44A, the third power chip 42D, and the fourth power chip 44D can construct a full-bridge circuit.

To be noted, in this embodiment, the dimension of the third power chip 42D is equal to that of the fourth power chip 44D, but this invention is not limited to this. In practice, the dimension of the third power chip 42D may be larger than or smaller than that of the fourth power chip 44D.

Figure 10:
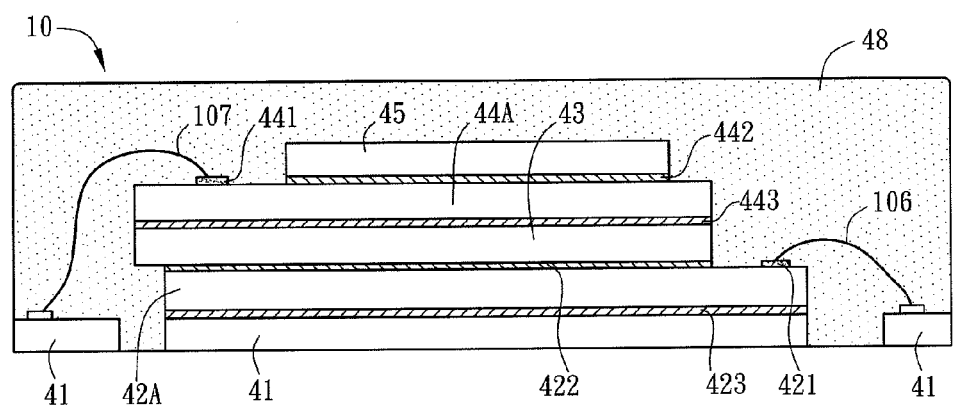
FIG. 10 is a cross-sectional view of another aspect of the power semiconductor package structure according to the preferred embodiment of the present invention.

FIG. 10 is a cross-sectional view of another power semiconductor package structure 10 according to the preferred embodiment of the present invention. Compared with the power semiconductor package structure 4A, the power semiconductor package structure 10 includes a first electronic connector 106 and a second electronic connector 107, which are respectively a bonding wire. For some circumstances that the parasitic parameter control of the control loop is not so critical, the wire bonding process can be applied to form the first electronic connector 106 and the second electronic connector 107 for leading out the first control electrode 421 and the second control electrode 441.

Figure 11:
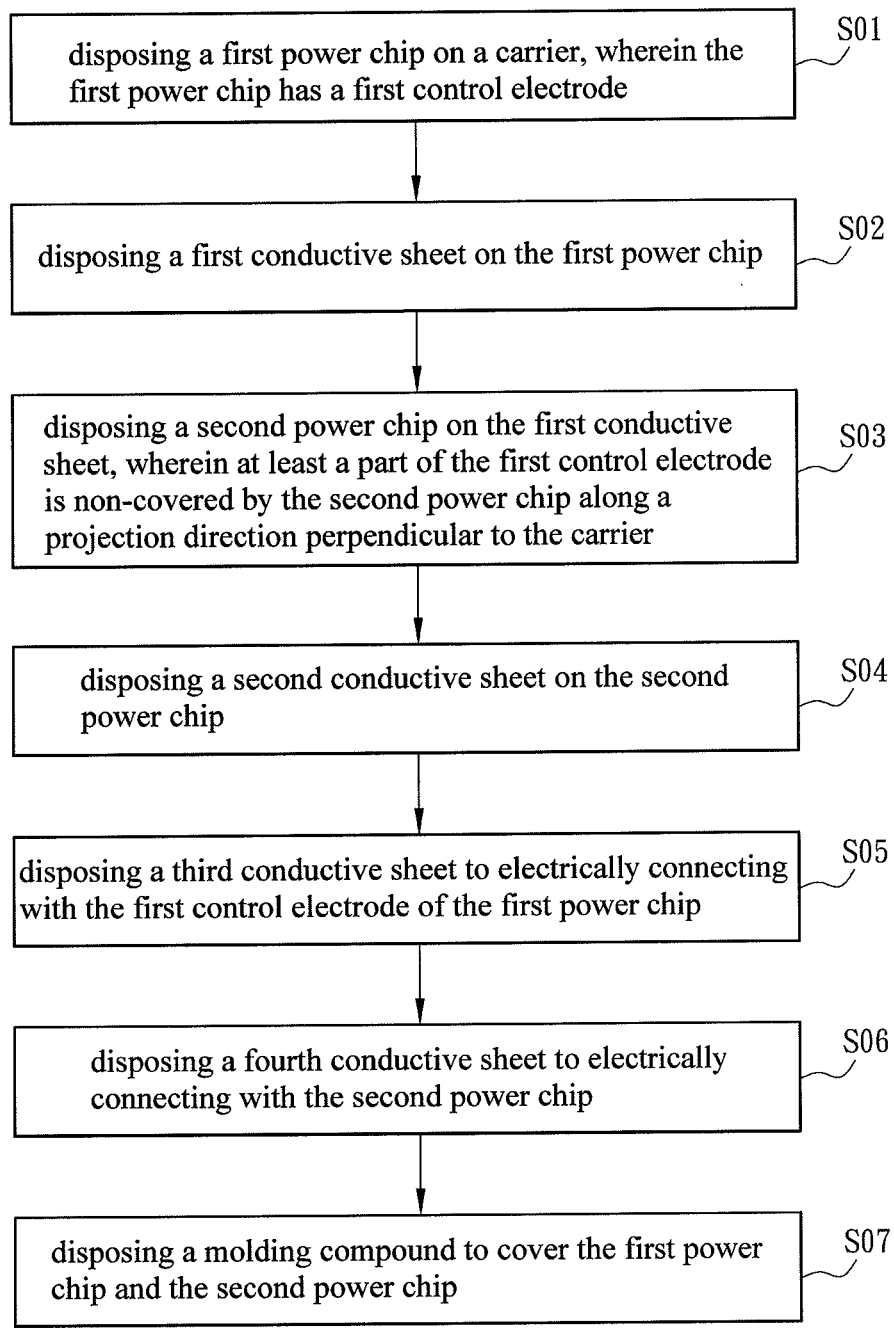
FIG. 11 is a flow chart of a manufacturing method of a power semiconductor package structure according to the preferred embodiment of the present invention.

The manufacturing method of the power semiconductor package structure according to the preferred embodiment of the present invention will be illustrated hereinbelow with reference to FIG. 11 in view of FIG. 4A. The manufacturing method is used for manufacturing, for example, the above-mentioned power semiconductor package structure 4A and includes the steps S01 to S07.

The step S01 is to dispose a first power chip 42A, which has a first control electrode 421, on a carrier 41. In this embodiment, the first power chip 42A includes a first control electrode 421, a first main power electrode 422, and a second main power electrode 423. The second main power electrode 423 of the first power chip 42A is electrically connected to the carrier through an adhesive layer.

The step S02 is to dispose a first conductive sheet 43 on the first power chip 42A. In this embodiment, the first conductive sheet 43 is electrically connected with the first main power electrode 422 of the first power chip 42A.

The step S03 is to dispose a second power chip 44A on the first conductive sheet 43. Herein, at least a part of the first control electrode 421 is not covered by the second power chip 44A along a projection direction perpendicular to the carrier 41. In this embodiment, the second power chip 44A includes a second control electrode 441, a third main power electrode 442, and a fourth main power electrode 443. The first conductive sheet 43 is disposed on the fourth main power electrode 443. Since the projections of the second power chip 44A and the first control electrode 421 of the first power chip along the direction perpendicular to the carrier 41 are not overlapped with each other, the short circuit between the first control electrode 421 and the fourth main power electrode 443 can be prevented without adding any protection material to insulate the first control electrode 421 and the fourth main power electrode 443.

The step S04 is to dispose a second conductive sheet 45 on the second power chip 44A. In this embodiment, the second conductive sheet 45 is electrically connected with the third main power electrode 442 of the second power chip 44A.

The step S05 is to dispose a third conductive sheet 46 to electrically connecting with the first control electrode 421 of the first power chip 42A. In this embodiment, one end of the third conductive sheet 46 is electrically connected with the first control electrode 421 of the first power chip 42A, and the other end thereof is electrically connected with the carrier 41.

The step S06 is to dispose a fourth conductive sheet 47 to electrically connecting with an electrode of the second power chip 44A. In this embodiment, one end of the fourth conductive sheet 47 is electrically connected with the second control electrode 441 of the second power chip 44A, and the other end thereof is electrically connected with the carrier 41.

The step S07 is to dispose a molding compound 48 to cover the first power chip 42A and the second power chip 44A. In practice, the carrier 41 can be a circuit board, which is configured with a circuit layout or traces.

Of course, the above-mentioned processes will be followed by other processes such as the surface cleaning process, separating process, and test process. Since these following processes are not the feature of the present invention, their descriptions are omitted. Besides, it is possible to add some auxiliary processes such as the adhesive layer dispensing process, supersonic cleaning, plasma cleaning, substrate baking, etc., and they are also omitted.

Of course, the above-mentioned manufacturing method of the embodiment can also be applied to manufacture the previous power semiconductor package structures 4B and 4C. Since the manufacturing method of the power semiconductor package structures 4B and 4C are substantially the same as that of the power semiconductor package structure 4A, the detailed descriptions thereof will be omitted. In other words, the manufacturing method of the present invention is suitable for manufacturing the power semiconductor package structures, in which the dimension of the first power chip is equal to that of the second power chip, the dimension of the first power chip is larger than that of the second power chip, and the dimension of the first power chip is smaller than that of the second power chip.

Figure 12A:
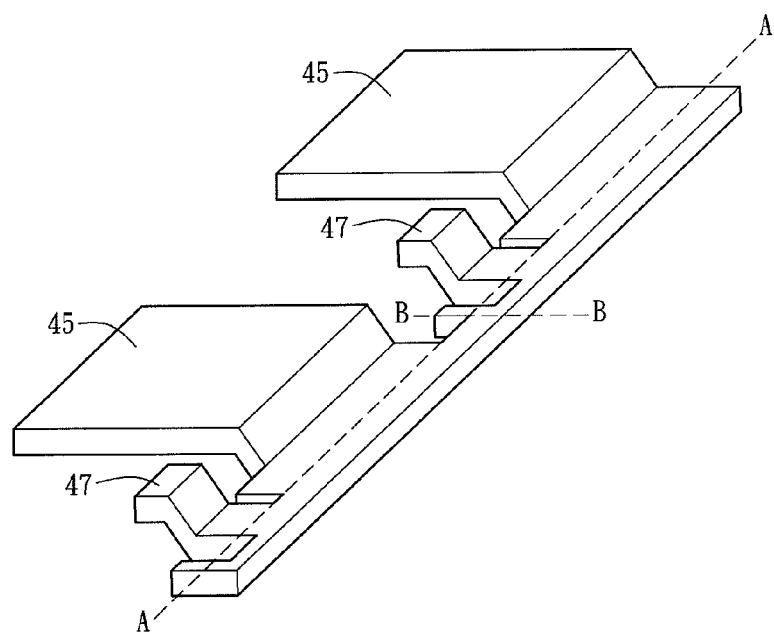
FIGS. 12A and 12B are schematic diagrams of a power semiconductor package structure according to the preferred embodiment of the present invention.
Figure 12B:
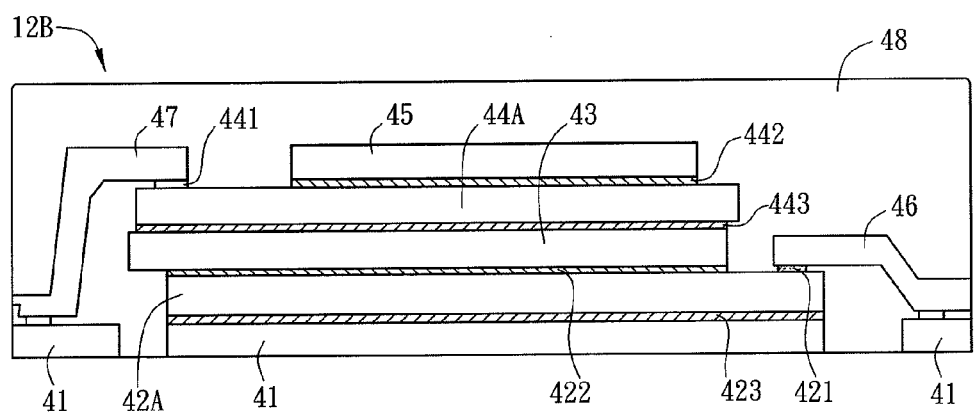

In order to simplify the packaging processes, a plurality of power semiconductor package structures can be arranged in matrix, and the steps S01 to S07 of the manufacturing method can be simultaneously applied to these power semiconductor package structures can be arranged in matrix. The second conductive sheet 45 and the fourth conductive sheet 47 for connecting the second control electrode 441 and the third main power electrode 442 of the second power chip 44A can be made of a single metal sheet as shown in FIG. 12A. Similarly, the first conductive sheet 43 and the third conductive sheet 46 can also be made of a single metal sheet. Then, after the step S07 of providing the molding compound 48 to cover the first power chip 42A and the second power chip 44A, a cutting step S08 is performed to cutting the metal sheet along line A-A and line B-B. Accordingly, a plurality of power semiconductor package structure 12B as shown in FIG. 12B can be manufactured.

In addition, the above-mentioned steps only indicate some essential steps of the manufacturing method of the present invention, and the order of the steps is not limited to the above embodiment. In other words, the order of the steps can be varied according the actual application. For example, regarding to the circumstance that the control electrode is leaded out by the metal sheet, the above-mentioned steps S05 and S02 can be performed at the same time, and the above-mentioned steps S06 and S04 can be performed at the same time. Regarding to the circumstance that the control electrode is leaded out by the bonding wire, the steps S01 to S07 are performed in order. In addition, it is also possible to separately and simultaneously assemble two parts, and then combine the two parts to form the power semiconductor package structure. One part includes the first power chip 42A, the carrier 41, the first conductive sheet 43, and the third conductive sheet 46, and the other part includes the second power chip 44A, the second conductive sheet 45, and the fourth conductive sheet 47. That is, the step S02 and S05 and the steps S04 and S06 are separately and simultaneously performed, and then the step S07 is performed. An advantage of this manufacturing method is to test the electronic properties of the separate parts. This can filter out the failed parts so as to increase the product yield and decrease the loss. Of course, the assembling and combining processes of the separate parts can have many variations, and the descriptions thereof are not illustrated.

To sum up, in the power semiconductor package structure of the present invention, at least a part of the first control electrode, which is disposed underneath the first power chip, is non-covered by the second power chip stacked thereabove along a projection direction perpendicular to the carrier. Thus, it is unnecessary to apply additional protection material to isolate the first control electrode from the bottom of the second power chip. In addition, the present invention uses the conductive sheets to electrically connect the electrodes of the first and second power chips, so that the parasitic effect caused by the bonding wires can be avoided. Accordingly, the reliability can be increased, the parasitic effect can be reduced, and the efficiency can be enhanced.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A power semiconductor package structure, comprising:
a carrier;
a first power chip having a first surface and a second surface opposing to the first surface, wherein a first control electrode and a first main power electrode are disposed on the first surface, a second main power electrode is disposed on the second surface, and the second surface is disposed on the carrier and electrically connected to the carrier through the second main power electrode;
a second power chip having a third surface and a fourth surface opposing to the third surface, wherein a third main power electrode is disposed on the third surface, a fourth main power electrode is disposed on the fourth surface, and the fourth surface is disposed on the first power chip;

a first conductive sheet electrically connected to the first main power electrode and the fourth main power electrode;
a second conductive sheet electrically connected to the third main power electrode; and
a third conductive sheet electrically connected to the first control electrode;
wherein, at least a part of the first control electrode is non-covered by the second power chip along a projection direction perpendicular to the carrier.

2. A power semiconductor package structure, comprising:
a carrier;
a first power chip having a first surface and a second surface opposing to the first surface, wherein a first control electrode and a first main power electrode are disposed on the first surface, a second main power electrode is disposed on the second surface, and the second surface is disposed on the carrier and electrically connected to the carrier through the second main power electrode;
a second power chip having a third surface and a fourth surface opposing to the third surface, wherein a third main power electrode is disposed on the third surface, a fourth main power electrode is disposed on the fourth surface, and the fourth surface is disposed on the first power chip;
a first conductive sheet electrically connected to the first main power electrode and the fourth main power electrode; and
a second conductive sheet electrically connected to the third main power electrode;
wherein, the dimension of the second power chip is not smaller than that of the first power chip, and at least a part of the first control electrode is non-covered by the second power chip along a projection direction perpendicular to the carrier.

3. The power semiconductor package structure of claim 1, wherein the entire first control electrode is non-covered by the second power chip along the projection direction perpendicular to the carrier.

4. The power semiconductor package structure of claim 1, wherein the second power chip further comprises:
a second control electrode disposed on the third surface; and
a fourth conductive sheet electrically connected to the second control electrode.

5. The power semiconductor package structure of claim 4, wherein each of the first conductive sheet, the second conductive sheet, the third conductive sheet, and the fourth conductive sheet is a metal sheet.

6. The power semiconductor package structure of claim 4, wherein at least one of the first conductive sheet, the second conductive sheet, the third conductive sheet, and the fourth conductive sheet has a recess.

7. The power semiconductor package structure of claim 4, wherein at least one of the first conductive sheet, the second conductive sheet, the third conductive sheet, and the fourth conductive sheet has a plurality of bending portions.

8. The power semiconductor package structure of claim 4, further comprising:
a molding compound covering the first power chip, the second power chip, a part of the carrier, a part of the first conductive sheet, a part of the second conductive sheet, a part of the third conductive sheet, and a part of the fourth conductive sheet, wherein at least one of the first conductive sheet, the second conductive sheet, the third conductive sheet, and the fourth conductive sheet is not electrically connected with the carrier and protruded out of the molding compound.

9. The power semiconductor package structure of claim 4, wherein the third conductive sheet has a step shape, and one end portion of the third conductive sheet connecting to the first control electrode has a thickness smaller than that of other portions thereof.

10. The power semiconductor package structure of claim 2, wherein the second power chip further comprising:
a second control electrode disposed on the third surface;
a first electronic connector electrically connecting to the first control electrode; and
a second electronic connector electrically connecting to the second control electrode.

11. The power semiconductor package structure of claim 10, wherein each of the first conductive sheet and the second conductive sheet is a metal sheet, and each of the first electronic connector and the second electronic connector is a bonding wire.

12. The power semiconductor package structure of claim 10, wherein at least one of the first conductive sheet and the second conductive sheet has a recess.

13. The power semiconductor package structure of claim 4, further comprising:
a third power chip having a fifth surface and a sixth surface opposing to the fifth surface, wherein a third control electrode and a fifth main power electrode are disposed on the fifth surface, a sixth main power electrode is disposed on the sixth surface, and the sixth surface is disposed on the carrier and electrically connected to the carrier through the sixth main power electrode;
a fourth power chip having a seventh surface and an eighth surface opposing to the seventh surface, wherein a fourth control electrode and a seventh main power electrode are disposed on the seventh surface, an eighth main power electrode is disposed on the eighth surface, and the eighth surface is disposed on the third power chip; and
a fifth conductive sheet electrically connected to the fifth main power electrode and the eighth main power electrode;
wherein the second conductive sheet is electrically connected with the third main power electrode and the seventh main power electrode.

14. The power semiconductor package structure of claim 4, further comprising:
a supporter disposed between the carrier and the second power chip for supporting the second power chip.

15. The power semiconductor package structure of claim 10, further comprising:
a third power chip having a fifth surface and a sixth surface opposing to the fifth surface, wherein a third control electrode and a fifth main power electrode are disposed on the fifth surface, a sixth main power electrode is disposed on the sixth surface, and the sixth surface is disposed on the carrier and electrically connected to the carrier through the sixth main power electrode;
a fourth power chip having a seventh surface and an eighth surface opposing to the seventh surface, wherein a fourth control electrode and a seventh main power electrode are disposed on the seventh surface, an eighth main power electrode is disposed on the eighth surface, and the eighth surface is disposed on the third power chip; and
a fifth conductive sheet electrically connected to the fifth main power electrode and the eighth main power electrode;

wherein the second conductive sheet is electrically connected with the third main power electrode and the seventh main power electrode.

16. The power semiconductor package structure of claim 10, further comprising:
a supporter disposed between the carrier and the second power chip for supporting the second power chip.

17. A manufacturing method of a power semiconductor package structure, comprising steps of:
disposing a first power chip on a carrier, wherein the first power chip has a first control electrode;
disposing a first conductive sheet on the first power chip;
disposing a second power chip on the first conductive sheet, wherein at least a part of the first control electrode is non-covered by the second power chip along a projection direction perpendicular to the carrier;
disposing a second conductive sheet on the second power chip;
disposing a third conductive sheet to electrically connecting with the first control electrode of the first power chip;
disposing a fourth conductive sheet to electrically connecting with the second power chip; and
disposing a molding compound to cover the first power chip and the second power chip.

18. The manufacturing method of claim 17, wherein the carrier comprises a plurality of carrying units arranged in matrix, and a plurality of the first power chips are disposed on the carrying units respectively.

19. The manufacturing method of claim 18, wherein the first conductive sheet and the third conductive sheet are integrally formed as one piece to form a plurality of first electronic connecting units arranged in matrix, the second conductive sheet and the fourth conductive sheet are integrally formed as one piece to form a plurality of second electronic connecting units arranged in matrix, and the first electronic connecting units and the second electronic connecting units are disposed corresponding to the carrying units respectively.

20. The manufacturing method of claim 19, wherein the molding compound covers the carrying units, the first electronic connecting units, and the second electronic connecting units.

21. The manufacturing method of claim 20, wherein the carrying units, the first electronic connecting units, and the second electronic connecting units comprise a plurality of cutting channels respectively, and the cutting channels are relatively disposed between the carrying units, the first electronic connecting units, and the second electronic connecting units, so that the power semiconductor package structure is separated based on the cutting channels.

* * * * *